United States Patent
Kim et al.

(10) Patent No.: US 8,691,643 B2
(45) Date of Patent: Apr. 8, 2014

(54) METHODS OF FORMING SEMICONDUCTOR DEVICES

(75) Inventors: Kieun Kim, Seoul (KR); Yongkuk Jeong, Suwon-si (KR); Hyun-Kwan Yu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 13/239,858

(22) Filed: Sep. 22, 2011

(65) Prior Publication Data

US 2012/0142176 A1 Jun. 7, 2012

(30) Foreign Application Priority Data

Dec. 3, 2010 (KR) ........................ 10-2010-0122918

(51) Int. Cl.
*H01L 21/8238* (2006.01)

(52) U.S. Cl.
USPC ........... 438/199; 438/216; 438/287; 438/294; 438/591; 257/E21.628

(58) Field of Classification Search
USPC ................. 438/199, 216, 275, 591, 308, 287, 438/294–297; 257/E21.628
See application file for complete search history.

(56) References Cited

U.S. PATENT DOCUMENTS

| | | | | |
|---|---|---|---|---|
| 5,563,100 | A * | 10/1996 | Matsubara | 438/303 |
| 6,740,605 | B1 * | 5/2004 | Shiraiwa et al. | 438/795 |
| 2010/0311231 | A1 * | 12/2010 | Thei et al. | 438/587 |

FOREIGN PATENT DOCUMENTS

| | | |
|---|---|---|
| KR | 1020010046344 A | 6/2001 |
| KR | 1020020002165 A | 1/2002 |
| KR | 1020060091414 A | 8/2006 |

* cited by examiner

*Primary Examiner* — Thanhha Pham
(74) *Attorney, Agent, or Firm* — Myers Bigel Sibley & Sajovec, PA

(57) ABSTRACT

Methods of forming semiconductor devices are provided. The methods may include forming a gate pattern on an active region of a substrate. The methods may further include performing a deoxidization treatment on the substrate.

20 Claims, 6 Drawing Sheets

METHODS OF FORMING SEMICONDUCTOR DEVICES

CROSS-REFERENCE TO RELATED APPLICATION

This U.S. non-provisional patent application claims priority under 35 U.S.C. §119 to Korean Patent Application No. 10-2010-0122918, filed on Dec. 3, 2010, the disclosure of which is hereby incorporated by reference in its entirety.

BACKGROUND

The present disclosure relates to methods of forming semiconductor devices.

As the integration density of semiconductor devices increases, the area of a semiconductor device active region (e.g., as defined by a device isolation layer) may decrease.

In particular, active regions having different widths may be formed together in a single semiconductor device. As such, transistors formed in active regions having a smaller width may have a smaller channel width than transistors formed in active regions having a larger width. The transistors formed in the active regions having a smaller width may therefore have an increased threshold voltage as a result of the smaller channel width. In other words, a narrow width effect may occur in the semiconductor device due to the difference between the threshold voltage of transistors formed in the active regions having a smaller width and the threshold voltage of transistors formed in the active regions having a larger width.

Moreover, as the channel width of the active regions having a smaller width decreases, the threshold voltage may further increase and the narrow-width effect occurring in the semiconductor device may increase in intensity.

SUMMARY

Embodiments of the inventive concept may provide methods of forming semiconductor devices. The methods may include providing a substrate including a device isolation layer defining an active region. The methods may also include forming a high-k dielectric layer and a gate pattern crossing the active region. The methods may further include performing a deoxidization treatment on substantially an entire surface of the substrate.

In some embodiments, the deoxidization treatment may include removing oxygen from edges of the active region covered with the gate pattern.

In some embodiments, the deoxidization treatment may include removing oxygen from the high-k dielectric layer.

In some embodiments, the methods may further include forming an etch stop layer covering the gate pattern and the active region.

In some embodiments, the etch stop layer may include silicon nitride.

In some embodiments, the deoxidization treatment may include performing a plasma process in an ammonia gas or a hydrogen gas atmosphere before forming the etch stop layer.

In some embodiments, the deoxidization treatment may include irradiating ultraviolet rays on substantially the entire surface of the substrate before forming the etch stop layer.

In some embodiments, the methods may further include irradiating ultraviolet rays on the etch stop layer after forming the etch stop layer.

In some embodiments, the high-k dielectric layer may include hafnium oxide.

In some embodiments, the high-k dielectric layer may include lanthanum oxide.

In some embodiments, the gate pattern may include a metallic material.

In some embodiments, the gate pattern may include at least one of titanium nitride or silicon.

According to some embodiments, methods of forming semiconductor devices may include forming a gate pattern on an active region of a substrate. The methods may also include performing a deoxidization treatment on the substrate to remove oxygen from edges of the active region that are closest to a surface of the gate pattern. The methods may further include, after performing the deoxidization treatment, forming an etch stop layer on the gate pattern.

In some embodiments, the methods may further include, before forming the gate pattern, forming a high-k dielectric layer on the active region. Also, the high-k dielectric layer may be between the edges of the active region and the gate pattern.

In some embodiments, the methods may further include, before performing the deoxidization treatment, forming spacers on sidewalls of the gate pattern.

In some embodiments, forming the etch stop layer may include forming the etch stop layer on a top surface of the gate pattern and on the spacers.

In some embodiments, the methods may further include irradiating ultraviolet rays on the etch stop layer.

According to some embodiments, methods of forming semiconductor devices may include forming a high-k dielectric layer on an active region of a substrate. The methods may also include forming a metallic gate pattern on the high-k dielectric layer. The methods may further include performing a deoxidization treatment on edges of the active region that are adjacent a boundary between the active region and the high-k dielectric layer, and that are adjacent a boundary between the active region and a device isolation pattern, the deoxidization treatment including one of a plasma process in an ammonia gas atmosphere, a plasma process in a hydrogen gas atmosphere, or irradiating ultraviolet rays.

In some embodiments, the methods may further include, after performing the deoxidization treatment, forming an etch stop layer on the metallic gate pattern.

In some embodiments, the methods may further include irradiating ultraviolet rays on the etch stop layer.

BRIEF DESCRIPTION OF THE DRAWINGS

The above and other features and advantages of the disclosure will become more apparent by describing in detail example embodiments thereof with reference to the attached drawings in which.

DETAILED DESCRIPTION

Figure 1:
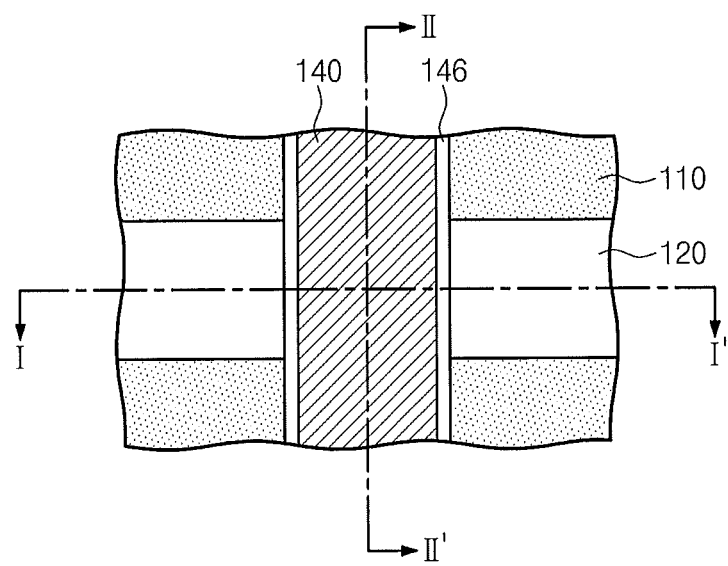
FIGS. 1 through 3B illustrate a method of forming a semiconductor device, according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
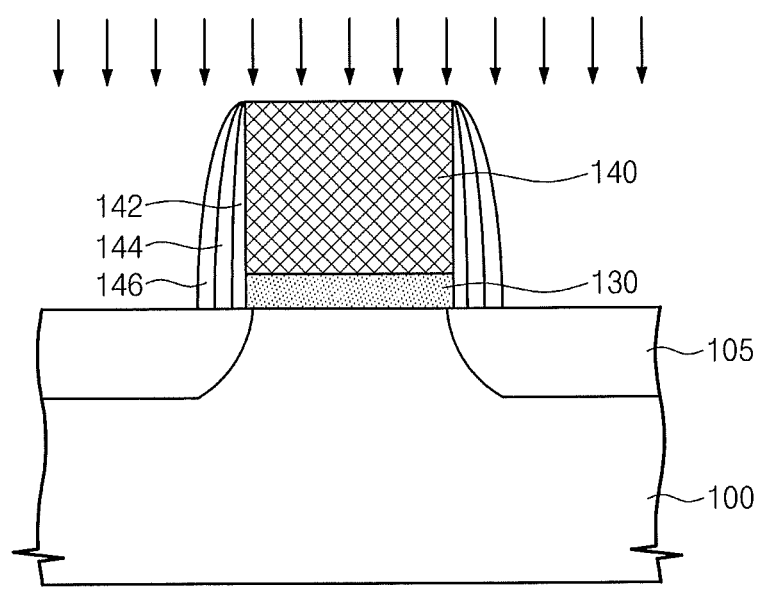
Figure 2B:
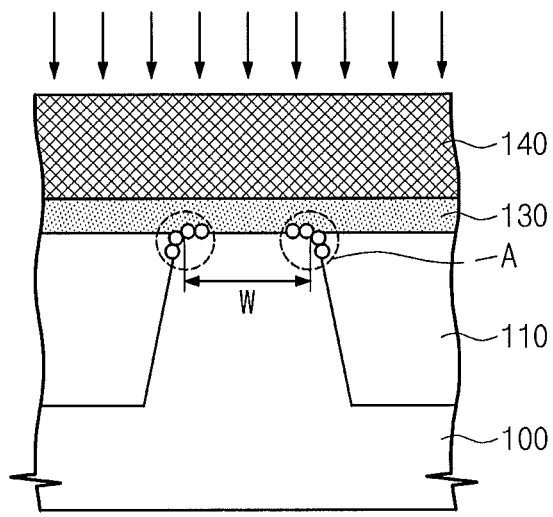
Figure 3A:
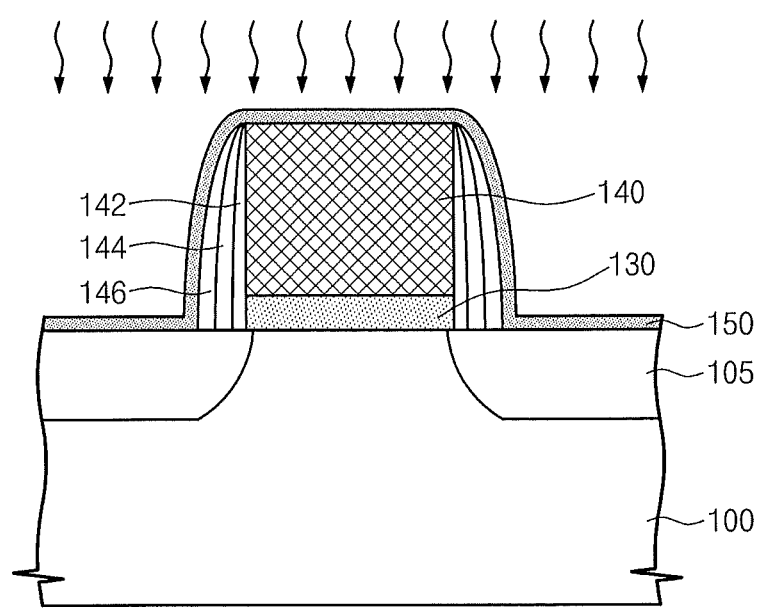
Figure 3B:
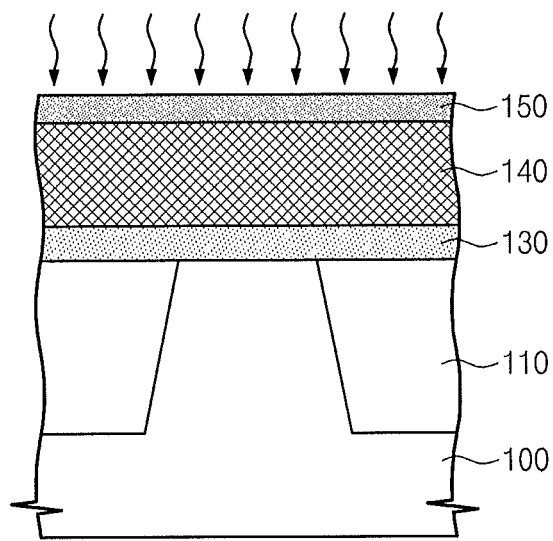

FIGS. 1 through 3B illustrate a method of forming a semiconductor device, according to some embodiments. FIG. 2A is a cross-sectional view taken along the line I-I' of FIG. 1, and FIG. 2B is a cross-sectional view taken along the line II-II' of FIG. 1. FIG. 3A is a cross-sectional view illustrating a subsequent process for FIG. 2A, and FIG. 3B is a cross-sectional view illustrating a subsequent process for FIG. 2B.

Referring to FIGS. 1 through 3B, a device isolation layer 110 defining an active region 120 may be formed in a substrate 100. The device isolation layer 110 may be formed by a shallow trench isolation (STI) process. Forming the device isolation layer 110 may include forming a trench in the substrate 100 and forming an insulation layer filling the trench.

A high-k dielectric layer 130 and a gate pattern 140 crossing the active region 120 may be sequentially formed. The high-k dielectric layer 130 may include a material having a high dielectric constant (e.g., dielectric constant "k"). The high-k dielectric layer 130 may include at least one of hafnium oxide and/or lanthanum oxide. The gate pattern 140 may include a metallic material (e.g., titanium nitride and/or silicon). For example, according to some embodiments, the gate pattern 140 may include a titanium nitride layer and a silicon layer that are sequentially stacked.

Referring to FIGS. 1, 2A, and 3A, a first spacer 142, a second spacer 144, and a third spacer 146 may be sequentially formed on sidewalls of the gate pattern 140. The first, second, and third spacers 142, 144, and 146 may each include at least one of a silicon oxide layer and a silicon nitride layer. For example, the first spacer 142 may be formed of a silicon oxide layer, the second spacer 144 may be formed of a silicon nitride layer, and the third spacer 146 may be formed by stacking a silicon oxide layer and a silicon nitride layer. Moreover, it will be understood that the order and shapes of the spacers 142, 144 and 146 may vary according to the characteristics of a corresponding transistor of the semiconductor device.

A source/drain region 105 may be formed in the active region 120 adjacent the gate pattern 140. The source/drain region 105 may be formed by performing one or more ion implantation processes using the gate pattern 140 and the spacers 142, 144, and 146 as masks. For example, the ion implantation process(es) may be performed using a different junction depth and a different injection energy after forming each of the gate pattern 140, the first spacer 142, the second spacer 144, and the third spacer 146.

Referring to FIG. 2B, a deoxidization treatment may be performed on substantially an entire surface of the substrate 100. The deoxidization treatment may include removing oxygen (indicated as "o" in FIG. 2B) from edges (portions indicated as "A" in FIG. 2B) of the active region 120, which is covered with the gate pattern 140. An oxygen concentration of the edges A of the active region 120 may decrease as a result of the deoxidization treatment.

According to some embodiments, the oxygen concentration of the edges A of the active region 120 may be reduced/minimized by the deoxidization treatment. When a gate voltage is applied to the gate pattern 140, oxygen atoms in/along the edges A of the active region 120 may be transferred to the gate pattern 140 such that holes may be generated at the edges A of the active region 120. Subsequently, additional oxygen atoms may be transferred to the holes that are generated at the edges A of the active region 120 by subsequent processes (e.g., a heat treatment and/or an oxygen injection process). The additional oxygen atoms may increase the threshold voltage of the semiconductor device. However, according to some embodiments herein, the oxygen concentration of the edges A of the active region 120 may be reduced/minimized. Therefore, the generation of holes at the edges A of the active region 120 caused by transferring oxygen atoms at the edges A of the active region 120 to the gate pattern 140 may be reduced/minimized. Also, a gathering of excess oxygen atoms at the generated holes may be reduced/minimized. As a result, increases in the threshold voltage of the semiconductor device may be reduced/minimized, and a semiconductor device having improved reliability and electrical characteristics may thus be achieved.

According to some embodiments, at least some of the oxygen atoms in the high-k dielectric layer 130 may be also removed by the deoxidization process. Therefore, the transfer of unstably-bonded oxygen atoms among the oxygen atoms in the high-k dielectric layer 130 from the high-k dielectric layer 130 to the active region 120 may be reduced/minimized.

If the high-k dielectric layer 130 includes a hafnium oxide layer, then oxygen atoms that are unstably bonded with hafnium atoms in the hafnium oxide layer may be separated from the hafnium atoms by a subsequent high-temperature process. In other words, the unstable bonds between the oxygen and hafnium atoms may be dissociated as a result of the high-temperature process. The dissociated oxygen atoms are transferred to the active region 120 and, as a result, the oxygen atom concentration of the edges A of the active region 120 may increase. However, according to some embodiments herein, transfer of the oxygen atoms from the high-k dielectric layer 130 to the edges A of the active region 120 may be reduced/minimized by removing (e.g., through a deoxidization treatment) the unstably-bonded oxygen atoms among the oxygen atoms in the high-k dielectric layer. Therefore, a semiconductor device having improved reliability and electrical characteristics may be achieved.

As the width W of the active region 120 (e.g., the active region 120 defined between first and second portions of the device isolation layer 110) narrows, the portion of the active region 120 occupied by the edges A may increase. Also, the rate of change in threshold voltage caused by the oxygen atoms at the edges A of the active region 120 may increase as the width W of the active region 120 narrows.

A deoxidization treatment, however, may reduce changes in the threshold voltage. The deoxidization treatment may include performing a plasma process in an ammonia ($NH_3$) gas atmosphere, or a plasma process in a hydrogen ($H_2$) gas atmosphere. For example, the ammonia and hydrogen gases may be injected into a plasma apparatus to react with oxygen to remove the oxygen. Additionally or alternatively, the deoxidization treatment may include irradiating ultraviolet rays on substantially the entire surface of the substrate 100.

Referring to FIGS. 3A and 3B, an etch stop layer 150 may be formed covering the gate pattern 140 and the active region 120. For example, the etch stop layer 150 may be formed after performing the deoxidization treatment. The etch stop layer 150 may be formed of silicon nitride. The etch stop layer 150 may reduce/minimize over-etching during formation of a contact hole exposing the gate pattern 140 or the source/drain region 105.

After forming the etch stop layer 150, ultraviolet rays may be irradiated to substantially the entire surface of the substrate 100. As a result of the ultraviolet irradiation process, however, the etch stop layer 150 may experience a tensile stress. In particular, if the etch stop layer 150 includes silicon nitride, then nitrogen-hydrogen bonds and/or silicon-hydrogen bonds included in the etch stop layer 150 may be dissociated by the ultraviolet irradiation process, and the dissociated hydrogen atoms may be released from the etch stop layer 150. Therefore, the etch stop layer 150 may shrink, and may experience a tensile stress as a result of the shrinkage.

However, if the ultraviolet irradiation process is performed on the etch stop layer 150, then the hydrogen atoms released from the etch stop layer 150 may be combined with the oxygen atoms in the active region 120. As a result, the quantity of oxygen atoms (e.g., uncombined oxygen atoms) in the active region 120 may decrease. Therefore, a threshold voltage increase due to excessive oxygen atoms at the edges A in the active region 120 may be reduced/minimized.

Figure 4A:
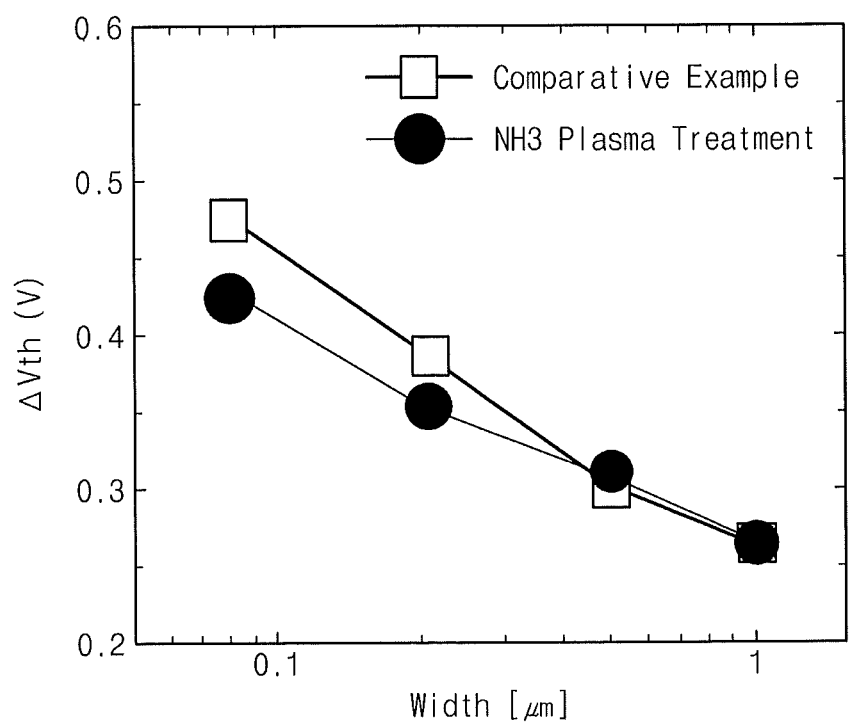
FIGS. 4A through 4C are graphs illustrating changes in threshold voltage after a deoxidization treatment has been performed, according to some embodiments.
Figure 4B:
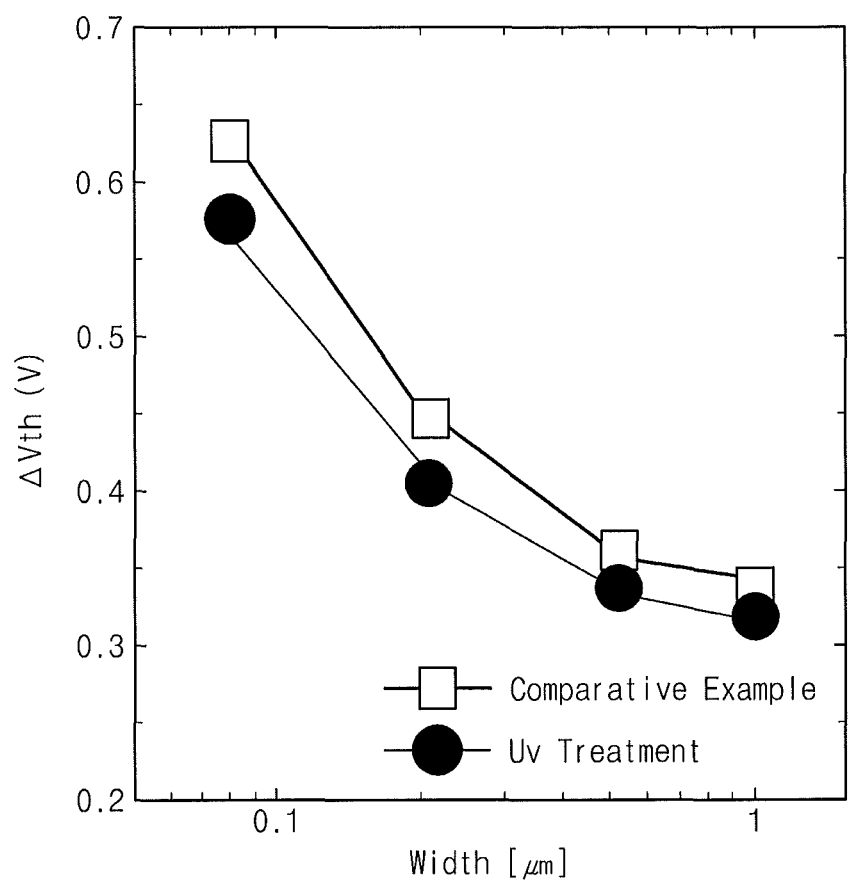
Figure 4C:
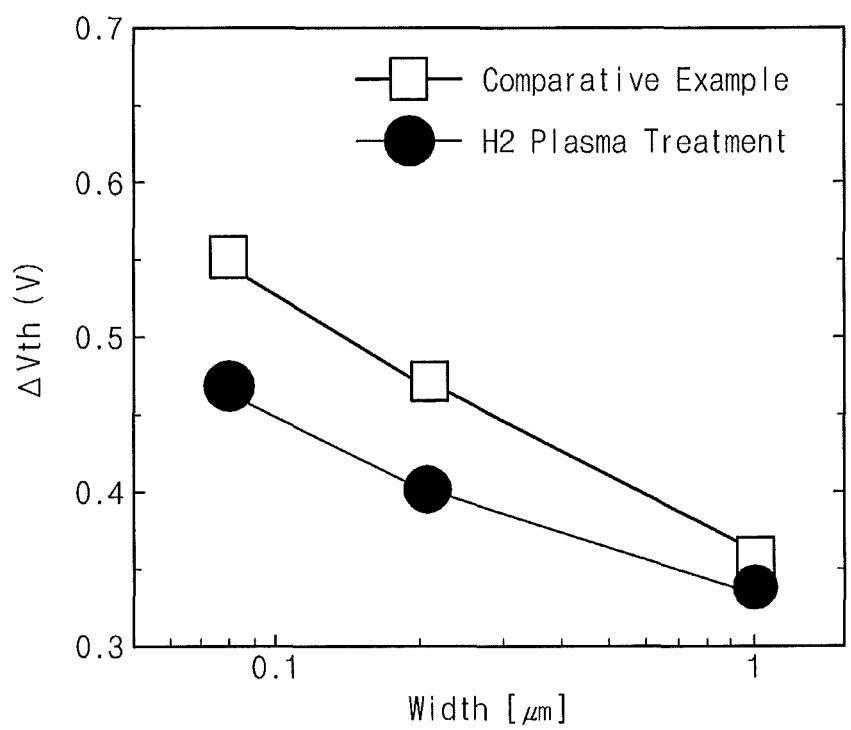

FIGS. 4A through 4C are graphs illustrating changes in threshold voltage after a deoxidization treatment has been performed, according to some embodiments of the inventive concept. In FIGS. 4A through 4C, the symbol "-□-" denotes a case where the deoxidization treatment is not performed, and the symbol "-•-" denotes a case where the deoxidization treatment has been performed, according to some embodiments of the inventive concept. In FIGS. 4A through 4C, the horizontal axis represents a channel width of a transistor, and the vertical axis represents changes in the threshold voltage ($\Delta V_{th}$).

FIG. 4A illustrates a case where a plasma process is performed in an ammonia atmosphere. Although the difference between the minimum and maximum values of the changes of threshold voltage is about 210 millivolts (mV) when a deoxidization treatment is not performed (as denoted by the symbol "-□-"), the difference between the minimum and maximum values is about 162 mV in a case where the deoxidization treatment (as denoted by the symbol "-•-") is performed. Therefore, a narrow-width effect may be improved (e.g., reduced) when the plasma process is performed in an ammonia atmosphere.

FIG. 4B illustrates a case where ultraviolet (UV) rays are irradiated before forming the etch stop layer 150. Although the difference between the minimum and maximum values of the changes of threshold voltage is about 285 mV if the deoxidization treatment is not performed, the difference between the minimum and maximum values is about 244 mV when the deoxidization treatment is performed. Therefore, the narrow-width effect may be improved (e.g., reduced) when the ultraviolet rays are irradiated.

FIG. 4C illustrates a case where a plasma process is performed in a hydrogen atmosphere. Although the difference between the minimum and maximum values of the changes of threshold voltage is about 187 mV when the deoxidization treatment is not performed, the difference between the minimum and maximum values is about 131 mV when the deoxidization treatment is performed. Therefore, a narrow-width effect may be improved (e.g., reduced) when the plasma process is performed in a hydrogen atmosphere.

Figure 5:
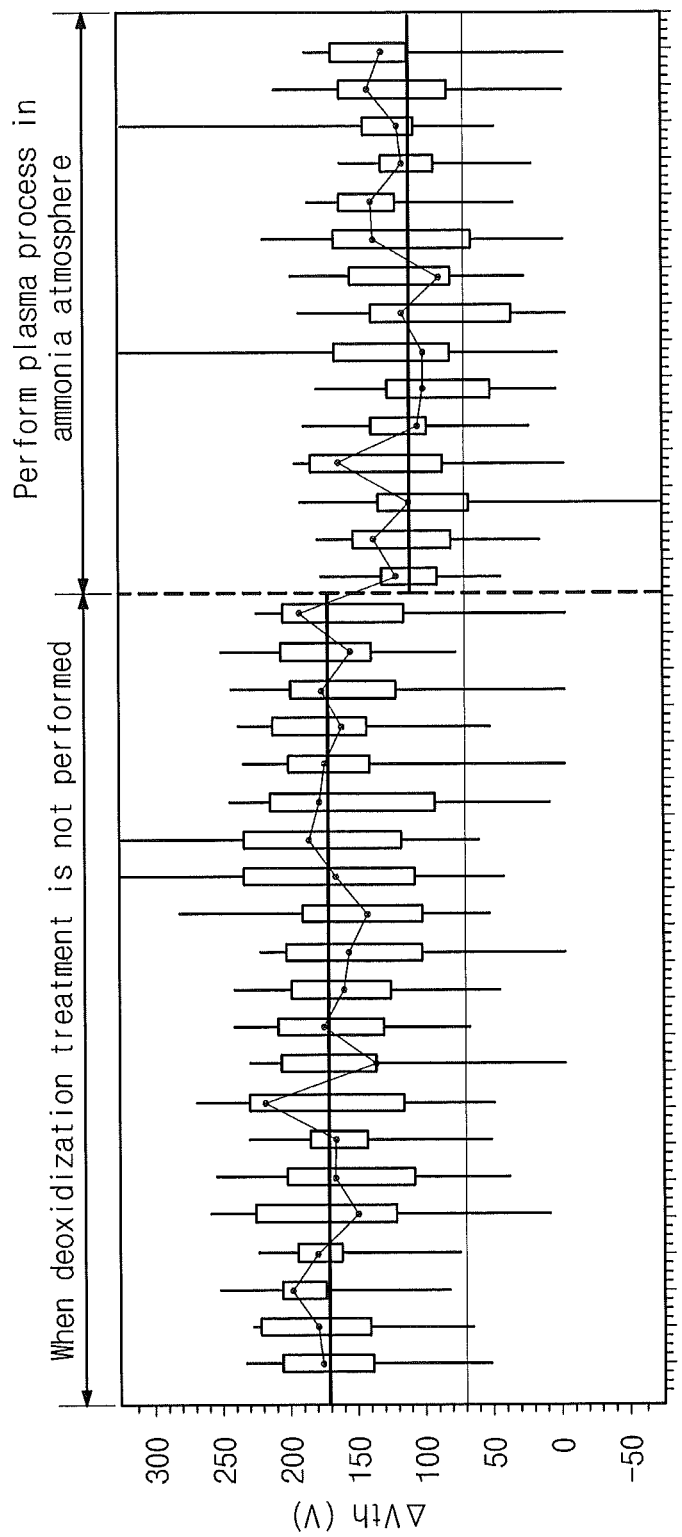
FIG. 5 is a graph illustrating changes in threshold voltage after a plasma process has been performed in an ammonia atmosphere, according to some embodiments.

FIG. 5 is a graph illustrating changes in threshold voltage when a plasma process is performed in an ammonia atmosphere, according to some embodiments of the inventive concept. FIG. 5 shows that the narrow-width effect may be improved (e.g., reduced) in various samples. The vertical axis of FIG. 5 represents changes in threshold voltage ($\Delta Vth$).

According to approximate average values in the various samples, an average value of the threshold voltage change is about 170 mV when the plasma process is not performed in an ammonia atmosphere, and the average value of the threshold voltage change is about 110 mV when the plasma process is performed in an ammonia atmosphere. Accordingly, the narrow-width effect may be improved (e.g., reduced) by decreasing changes of the threshold voltage.

According to some embodiments, changes in threshold voltage that are caused by oxygen transfer may be reduced/minimized by performing a deoxidization treatment. The deoxidization treatment may include performing a plasma process in an ammonia atmosphere or in a hydrogen gas atmosphere, or irradiating ultraviolet rays. By using the deoxidization treatment, a narrow-width effect may be improved (e.g., reduced) such that operating characteristics of the semiconductor device may be improved.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of forming a semiconductor device, comprising:
   forming a gate pattern on an active region of a substrate;
   performing a deoxidization treatment on the substrate to remove oxygen from edges of the active region that are closest to a surface of the gate pattern, wherein the deoxidization treatment comprises one of a plasma process in an ammonia gas atmosphere, a plasma process in a hydrogen gas atmosphere, or irradiating ultraviolet rays; and
   after performing the deoxidization treatment, forming an etch stop layer on the gate pattern.

2. The method of claim 1, further comprising:
   before forming the gate pattern, forming a high-k dielectric layer on the active region,
   wherein the high-k dielectric layer is between the edges of the active region and the gate pattern.

3. The method of claim 2, wherein the deoxidization treatment comprises removing oxygen from the high-k dielectric layer.

4. The method of claim 1, further comprising:
   before performing the deoxidization treatment, forming spacers on sidewalls of the gate pattern.

5. The method of claim 4, wherein forming the etch stop layer comprises forming the etch stop layer on a top surface of the gate pattern and on the spacers.

6. The method of claim 5, further comprising:
   irradiating ultraviolet rays on the etch stop layer.

7. The method of claim 1, wherein the etch stop layer includes silicon nitride.

8. The method of claim 1, wherein the deoxidization treatment comprises performing the plasma process in the ammonia gas atmosphere or the plasma process in the hydrogen gas atmosphere before forming the etch stop layer.

9. The method of claim 1, wherein the deoxidization treatment comprises irradiating ultraviolet rays on substantially an entire surface of the substrate before forming the etch stop layer.

10. The method of claim 1, further comprising irradiating ultraviolet rays on the etch stop layer after forming the etch stop layer.

11. The method of claim 1, wherein the gate pattern comprises a metallic material.

12. The method of claim 11, wherein the gate pattern comprises at least one of titanium nitride or silicon.

13. A method of forming a semiconductor device, comprising:
   forming a high-k dielectric layer on an active region of a substrate;
   forming a metallic gate pattern on the high-k dielectric layer; and
   performing a deoxidization treatment on edges of the active region that are adjacent a boundary between the active region and the high-k dielectric layer, and that are adjacent a boundary between the active region and a device isolation pattern, the deoxidization treatment including one of a plasma process in an ammonia gas atmosphere, a plasma process in a hydrogen gas atmosphere, or irradiating ultraviolet rays.

14. The method of claim 13, further comprising:
   after performing the deoxidization treatment, forming an etch stop layer on the metallic gate pattern.

15. The method of claim 14, further comprising:
   irradiating ultraviolet rays on the etch stop layer.

16. The method of claim 13, further comprising:
   before performing the deoxidization treatment, forming spacers on sidewalls of the metallic gate pattern.

17. The method of claim 13, wherein the deoxidization treatment comprises removing oxygen from the edges of the active region.

18. The method of claim 13, wherein the deoxidization treatment comprises removing oxygen from the high-k dielectric layer.

19. The method of claim 13, wherein the high-k dielectric layer comprises hafnium oxide.

20. The method of claim 13, wherein the high-k dielectric layer comprises lanthanum oxide.

* * * * *